(12) United States Patent
Yu et al.

(10) Patent No.: US 10,334,685 B2
(45) Date of Patent: Jun. 25, 2019

(54) CARBON DOT LIGHT EMITTING DIODES

(71) Applicants: Weiyong Yu, Shreveport, LA (US); Yu Zhang, Changchun (CN)

(72) Inventors: Weiyong Yu, Shreveport, LA (US); Yu Zhang, Changchun (CN)

(73) Assignee: Board of Supervisors of Louisiana State University and Agricultural and Mechanical College, Baton Rouge, LA (US)

( * ) Notice: Subject to any disclaimer, the term of this patent is extended or adjusted under 35 U.S.C. 154(b) by 484 days.

(21) Appl. No.: 14/940,336

(22) Filed: Nov. 13, 2015

(65) Prior Publication Data

US 2016/0164019 A1    Jun. 9, 2016

Related U.S. Application Data

(60) Provisional application No. 62/079,612, filed on Nov. 14, 2014.

(51) Int. Cl.
*H01L 51/50* (2006.01)
*H05B 33/08* (2006.01)
*H01L 51/00* (2006.01)

(52) U.S. Cl.
CPC ....... *H05B 33/0857* (2013.01); *H01L 51/502* (2013.01); *H01L 51/00* (2013.01); *H01L 51/0045* (2013.01); *H01L 51/5072* (2013.01); *H01L 2251/5369* (2013.01)

(58) Field of Classification Search
CPC ....... H01L 51/50; H01L 51/00; H01L 51/502; H01L 51/0045; H01L 51/5072; H01L 51/5012; H01L 51/5088; H01L 51/5056; H01L 51/5206
USPC .......................................................... 257/400
See application file for complete search history.

(56) References Cited

U.S. PATENT DOCUMENTS

| | | | |
|---|---|---|---|
| 7,811,675 B2* | 10/2010 | Che | C07D 213/22 252/301.16 |
| 2009/0109435 A1* | 4/2009 | Kahen | C09K 11/883 356/317 |
| 2012/0217477 A1* | 8/2012 | So | B82Y 30/00 257/21 |
| 2012/0248968 A1* | 10/2012 | Ogiwara | H01L 51/5012 313/504 |
| 2014/0057097 A1* | 2/2014 | Liu | C01B 31/0293 428/323 |
| 2014/0332787 A1* | 11/2014 | Hong | H05B 33/14 257/40 |

* cited by examiner

*Primary Examiner* — Chuong A Luu
(74) *Attorney, Agent, or Firm* — Davis & Bujold, PLLC; Charles G. Holoubek

(57) ABSTRACT

An electroluminescent LED device comprising a hole transport layer, an electron transport layer, an active emissive layer between the hole transport layer and the electron transport layer, and carbon dots forming the active emissive layer.

14 Claims, 16 Drawing Sheets

US 10,334,685 B2

CARBON DOT LIGHT EMITTING DIODES

CROSS REFERENCE TO RELATED APPLICATIONS/PRIORITY

The present invention claims priority to U.S. Provisional Patent Application No. 62/079,612, filed on Nov. 14, 2014, which is incorporated by reference into the present disclosure as if fully restated herein.

FIELD OF THE INVENTION

The present invention relates to the field of color display and white-light lighting. The invention comprises light-emitting diodes (LEDs) for color display and white-light lighting.

BACKGROUND OF THE INVENTION

Light-emitting diodes (LEDs) offer great prospects for developing low-cost, efficient, bright, and large area color displays and white-light lighting. Traditional LEDs use rare earth or organic luminescent materials. Quantum dots (QDs) based LEDs (QD-LEDs) exhibit size tunable spectral emission, allowing for the design and fabrication of color QD-LEDs with simple device configurations for individual pixel based color elements. However, a serious drawback of the present colloidal QD-LED technology is its dependence on the QDs with toxic heavy-metal components, such as cadmium, lead, and mercury which are detrimental to the environment and therefore potentially hinder the commercialization. Carbon nanoparticles (also called carbon dots, abbreviated as CDs) are recently developed new materials. They are easy to make from simple raw materials. Carbon is the earth abundant material, safe, biocompatible, and cheap. CDs also show different colors under light excitation (photoluminescence) with very high quantum yields. The inventors developed CD-based LEDs (CD-LEDs) for color display (e.g., computer monitors, TVs, phone screens, entertainment lighting, instrument back lighting) and white-light solid-state lighting (for buildings, rooms, personal reading/study, public areas, roads, etc.).

SUMMARY OF THE INVENTION

Wherefore, it is an object of the present invention to overcome the above mentioned shortcomings and drawbacks associated with the prior art.

The present invention uses carbon nanoparticles that can be nanosized crystalline or amorphous carbon particles, small graphene, short carbon nanotubes (single or multiple walls), with confining size varying from, preferably 0.5 nm to 20 nm, and more preferably 2 nm to 10 nm, as the electroluminescence materials to make light-emitting diodes (LEDs) for color display and white-light lighting. This invention adjusts injection current density by changing the thicknesses of the carrier transport layers and/or the electrode materials for different color and white-light emission.

The present invention also relates to an electroluminescent LED device comprising a hole transport layer, an electron transport layer, an active emissive layer between the hole transport layer and the electron transport layer, and carbon dots forming the active emissive layer.

The present invention also relates to a method of producing light comprising the step of supplying a current of electricity to an electroluminescent LED device, wherein the electroluminescent LED device comprises a hole transport layer, an electron transport layer, an active emissive layer between the hole transport layer and the electron transport layer, and carbon dots forming the active emissive layer.

BRIEF DESCRIPTION OF THE DRAWING

The accompanying drawings, which are incorporated in and constitute a part of the specification, illustrate various embodiments of the invention and together with the general description of the invention given above and the detailed description of the drawings given below, serve to explain the principles of the invention. It is to be appreciated that the accompanying drawings are not necessarily to scale since the emphasis is instead placed on illustrating the principles of the invention. The invention will now be described, by way of example, with reference to the accompanying drawings in which.

DETAILED DESCRIPTION OF THE INVENTION

The present invention will be understood by reference to the following detailed description, which should be read in conjunction with the appended drawings. It is to be appreciated that the following detailed description of various embodiments is by way of example only and is not meant to limit, in any way, the scope of the present invention.

Figure 1:
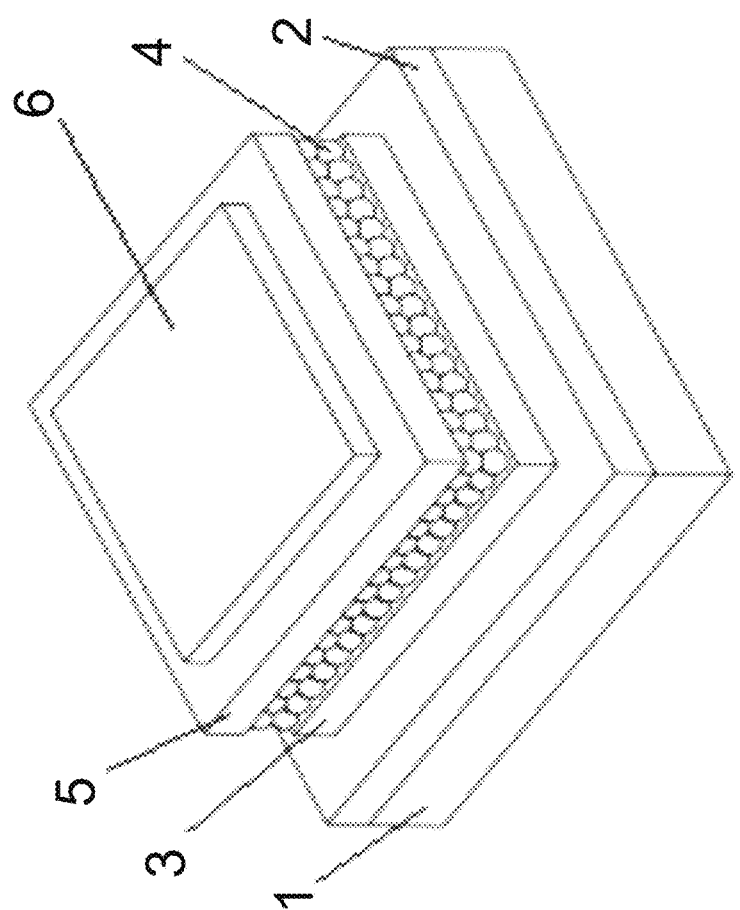
FIG. 1 is a schematic view, showing the general structure of the CD-LEDs.

Turning now to FIG. 1, a brief description concerning the various components of the present invention will now be briefly discussed. The carbon dots employed in the CD-LED devices can be synthesized by many existing methods. One approach is based on the publication of Wang, F.; Pang, S.; Wang, L.; Li, Q.; Kreiter, M.; Liu, C.-Y. One-Step Synthesis of Highly Luminescent Carbon Dots in Noncoordinating Solvents. *Chem. Mater.* 2010, 22, 4528-4530 using 1-octadecene as the noncoordinating solvent, 1-hexadecylamine as the surface passivation agent, and anhydrous citric acid as the carbon precursor. Such process incorporated by reference. The CDs are purified from the synthesis solution through a preferably multi-step precipitation/re-disperse process and subsequently dried as solid powders.

According to one embodiment, ZnO nanoparticle is used for the white-light LEDs. To synthesize ZnO nanoparticles, a mixture of 0.44 g zinc acetate and 30 mL ethanol is loaded into a three-neck flask and heated to 75° C. until a clear solution is obtained. After the solution is cooled down to room temperature, 10 mL NaOH/ethanol solution (0.5 mol/L) is injected into the flask. The solution is stirred for 12 hours, and the products are collected by precipitating with hexanes and re-dispersed in ethanol for device fabrication.

The general CD-LED device fabrication, shown in FIG. 1 starts with a UV-ozone treatment of a transparent conducting film as the anode 1. This transparent conducting film can be indium tin oxide (ITO), fluorine doped tin oxide (FTO), carbon nanotube networks, or graphene. The treatment is to enrich the surface with oxygen and, consequently, increase the anode film's work function. A hole injection layer (HIL) 2 of poly(ethylenedioxythiophene):polystyrene sulphonate (PEDOT:PSS) (10 to 100 nm) is then deposited on the UV-ozone treated anode 1 by spin-coating, followed by annealing in an oven at 120° C. for 10 min in air. Then, the sample is transferred into a nitrogen glove box system; the hole transport layer (HTL) 3 of poly(N,N'-bis(4-butylphenyl)-N,N'-bis(phenyl)benzidine) (poly-TPD) or other materials like poly(N-vinylcarbazole) (PVK), 10 to 100 nm in thickness, is spin cast on the top of the HIL 2 from their chlorobenzene solution and cured at 150° C. for 30 min on a hot plate. Subsequently, the CD-active emissive layer 4 (10 to 100 nm) is made by spin-coating over the surface of HTL 3 from its toluene solution and is baked on a hot plate at 80° C. for 30 min to form the active region of the CD-LED. The thickness of the CD-active emissive layer 4 is precisely tailored, by varying the CD concentration and the spin speed of the cast deposition, to balance the maximum brightness and emission efficiency of the CD-LEDs. Next is to make the electron transport layer (ETL) 5. For the 1,3,5-tris(N-phenylbenzimidazol-2-yl)benzene (TPBI)-based device, a 2 to 50 nm thick-TPBI ETL is thermally deposited over the CD-active emissive layer 4, followed by a LiF/Al (1 to 20 nm/10 to 300 nm) bilayer cathode 6 which is thermally evaporated through a shadow mask without breaking the vacuum. For the ZnO nanoparticle-based device, a 5 to 100 nm thick ZnO nanoparticle ETL is deposited over the CD-active emissive layer 4 by spin coating, and an Al (10 to 300 nm) cathode 6 is thermally evaporated through a shadow mask (no LiF layer).

The photoluminescence (PL, light emission from materials after the absorption of photons) spectra of CDs are recorded by PL photospectroscopy and time-resolved, pulsed laser excitation techniques are used for probing the lifetime of PL emission; these measurements and analyses can be used for the electron-hole recombination mechanism of the electroluminescence (EL, a material emits light in response to the passage of an electric current or to an electric field). The electrical characterization of the devices is performed on a Keithley 2400 source meter. The EL spectra and luminance of the devices (cd/m$^2$) are measured on a PR650 spectrometer. Images of the LED outputs are recorded with a Sony FWX700 FireWire color CCD camera. All measurements are performed under dark condition.

Figure 2:
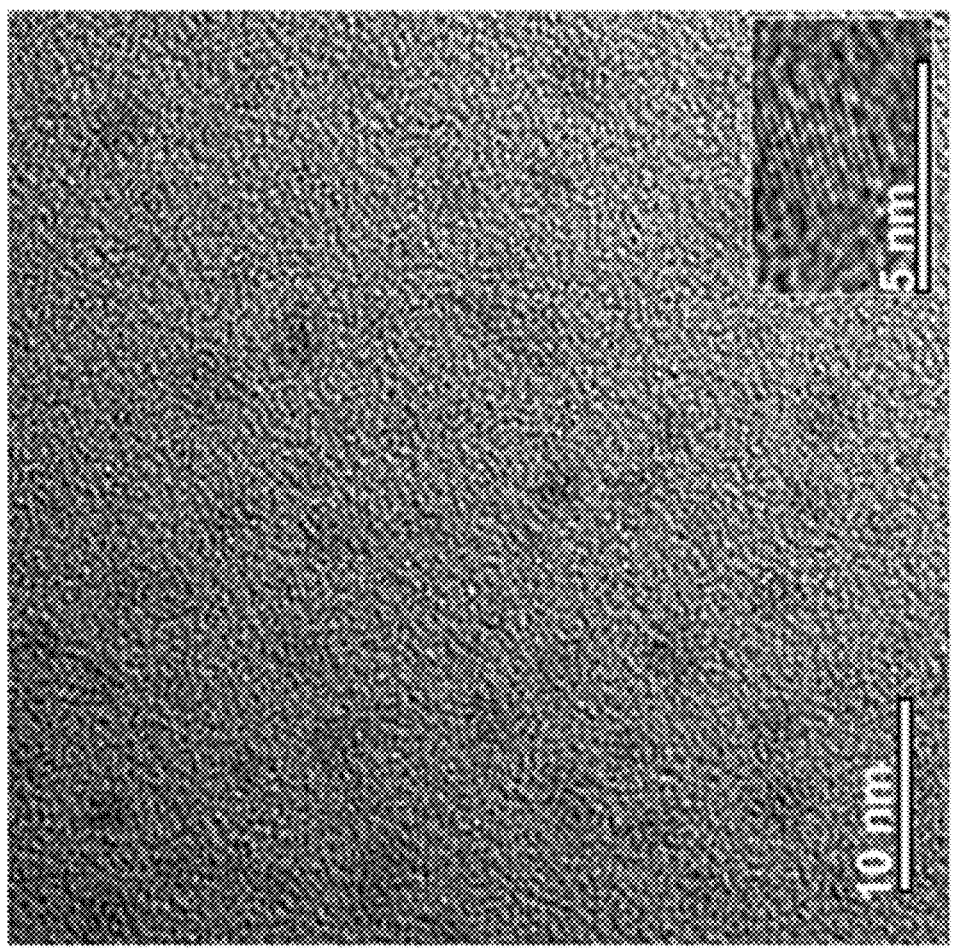
FIG. 2 is a transmission electron microscopy (TEM) image of CDs, with an inset showing high resolution transmission electron microscopy (HRTEM) image of a single dot.

The light color from the CD-LEDs is current density-dependent for the same CD particles. FIG. 2 shows the transmission electron microscopy (TEM) image of the carbon dots with an average diameter of 3.3 nm (one crystalline spherical CD particle of 1 nm in diameter contains about 30 to 80 carbon atoms); inset is a high resolution TEM image to show the crystalline structure of the CDs. Shape and size difference, hollow or solid particles, crystalline or amorphous structures, graphene or short carbon nanotubes (single or multiple walled) affect the actual wavelength of the emitting light, the efficiency, the luminance of the LED devices, and the color properties of the light (such as color temperature, color rendering index, color purity, CIE coordinate) and the device parameters (such as the thickness and materials of each layer in the device). The absorption spectrum of a CD film and the PL spectrum of the CD solution in toluene at an excitation wavelength of 340 nm are presented in FIG. 3, which exhibit three absorption peaks at 270, 315, and 450 nm, and a main PL peak at 420 nm respectively. FIG. 4 shows the true-color photograph of this emission. The full width at half maximum (FWHM) bandwidth of the luminescence band is between 90 and 95 nm, while the PL QY is determined to be ~40%, by using a spectrometer with an integrating sphere and a back-thinned CCD detector. The above mentioned characteristic data may vary with different type, size, and surface passivation of the CDs.

Figure 5:
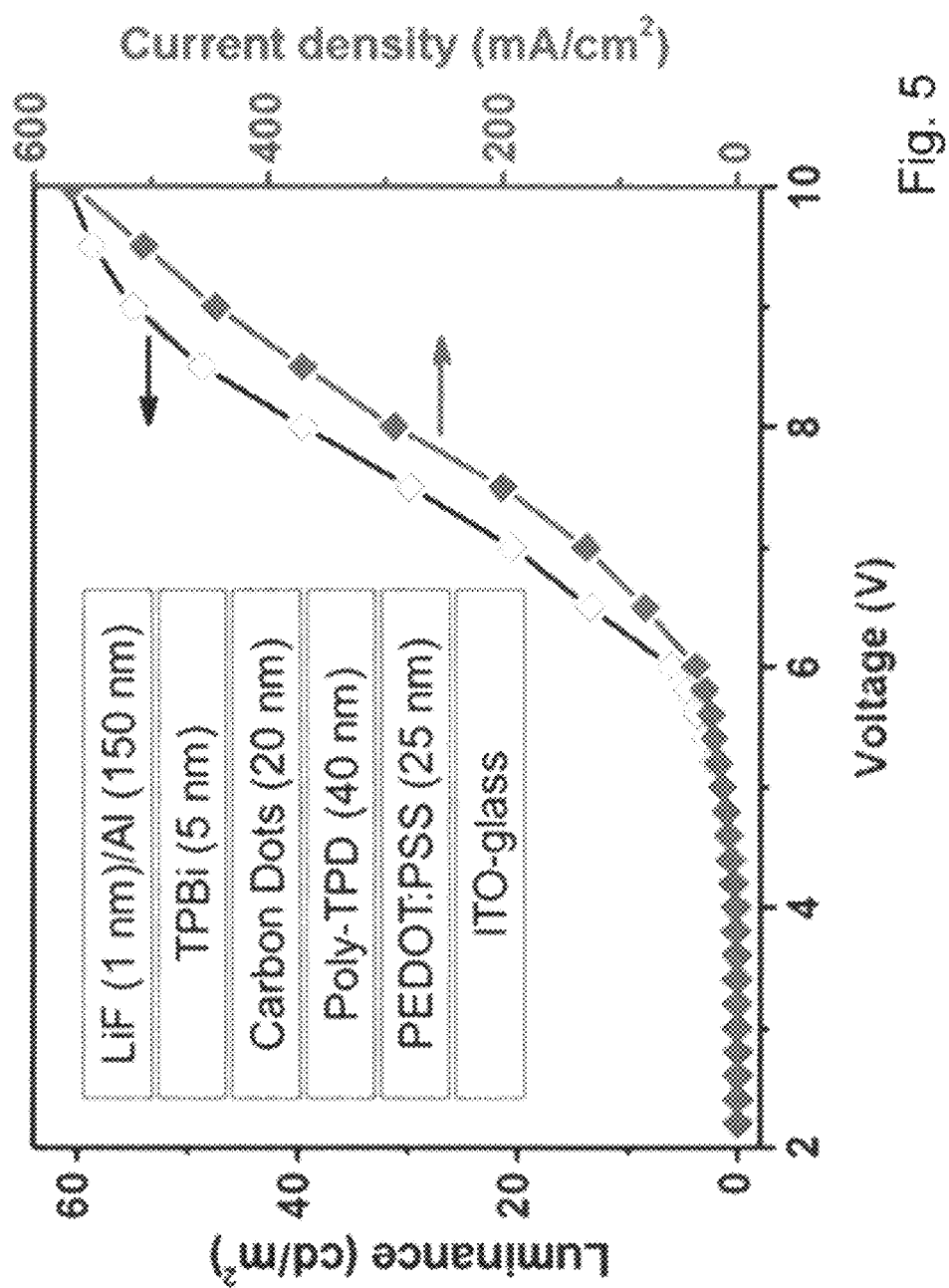
FIG. 5 shows current density and brightness of the CD-LEDs with an inset showing the device structure comprising ITO/PEDOT:PSS (anode), poly-TPD (hole transport layer), CDs (active emissive layer), TPBI (electron transport layer), and LiF/Al (cathode)

A schematic of the blue-white CD-LED device structure used in this invention is shown in the inset of FIG. 5. The device consists of a patterned ITO anode 1, a 25-nm thick PEDOT:PSS HIL 2, a 40-nm poly-TPD HTL 3, a 20-nm CD-active emissive layer 4, a 5-nm ETL 5, and a 1-nm LiF and 150-nm aluminum double layer as the cathode 6. PEDOT:PSS is used as a buffer layer on the anode mainly to increase the anode work function from 4.7 (ITO) to 5.0 eV and to reduce the surface roughness of the anode to obtain stable and pin-hole-free electrical conduction across the device. Poly-TPD is used as the HTL in consideration of the fact that its highest occupied molecular orbital (HOMO) level is 5.2 eV which is very close to the work function of the ITO/PEDOT:PSS, and also because it possesses an excellent hole-transport capability. Moreover, poly-TPD has been found to have good solubility in organic solvents such as chlorobenzene and thus makes it easy to form a uniform thin layer. TPBI is chosen as the ETL because of its good electron-transport capability and its interfacial phase compatibility with the CD layer.

Figure 6:
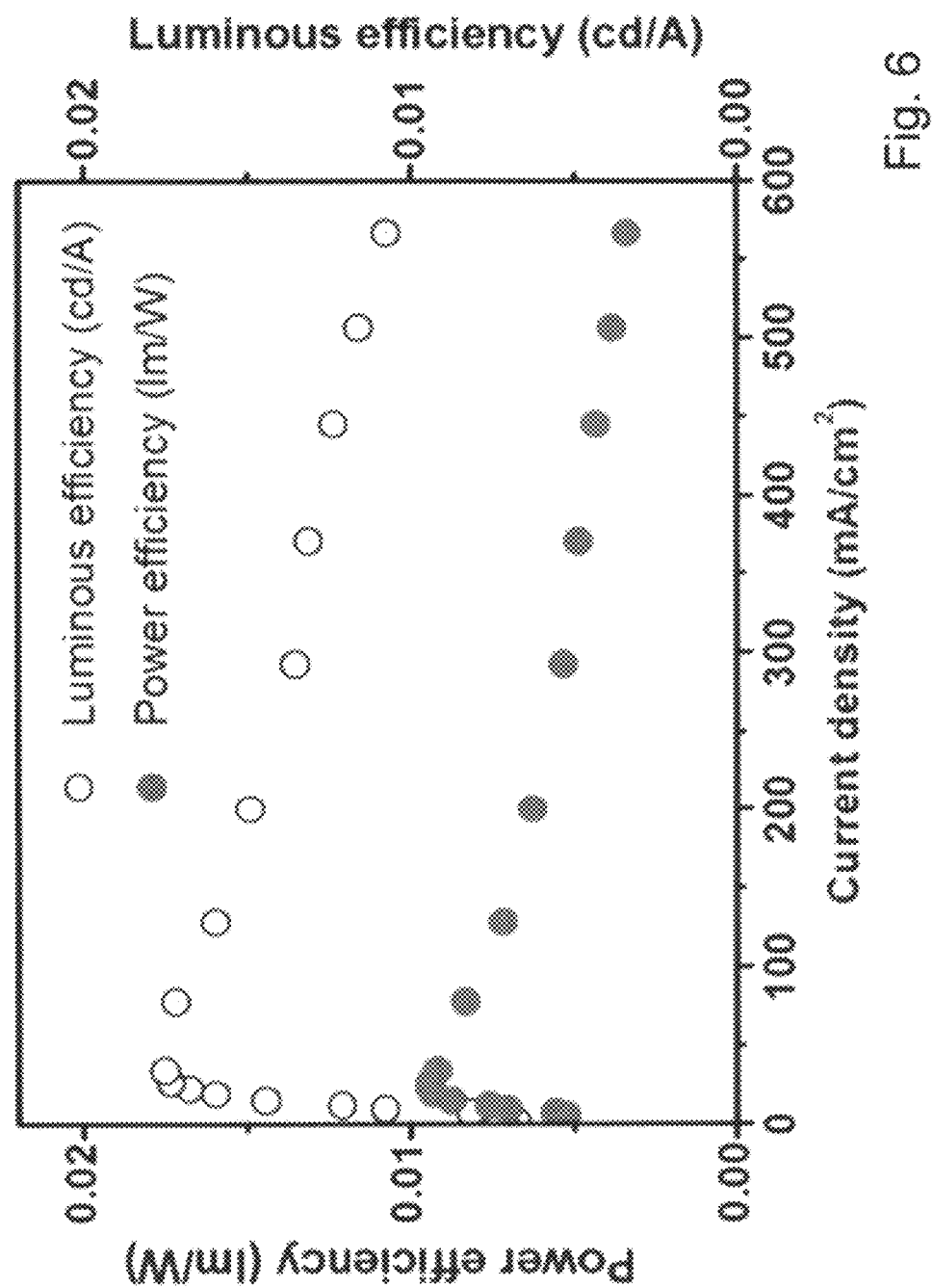
FIG. 6 is the luminous and power efficiencies vs. current density for the same CD-LEDs in FIG. 5.
Figure 7:
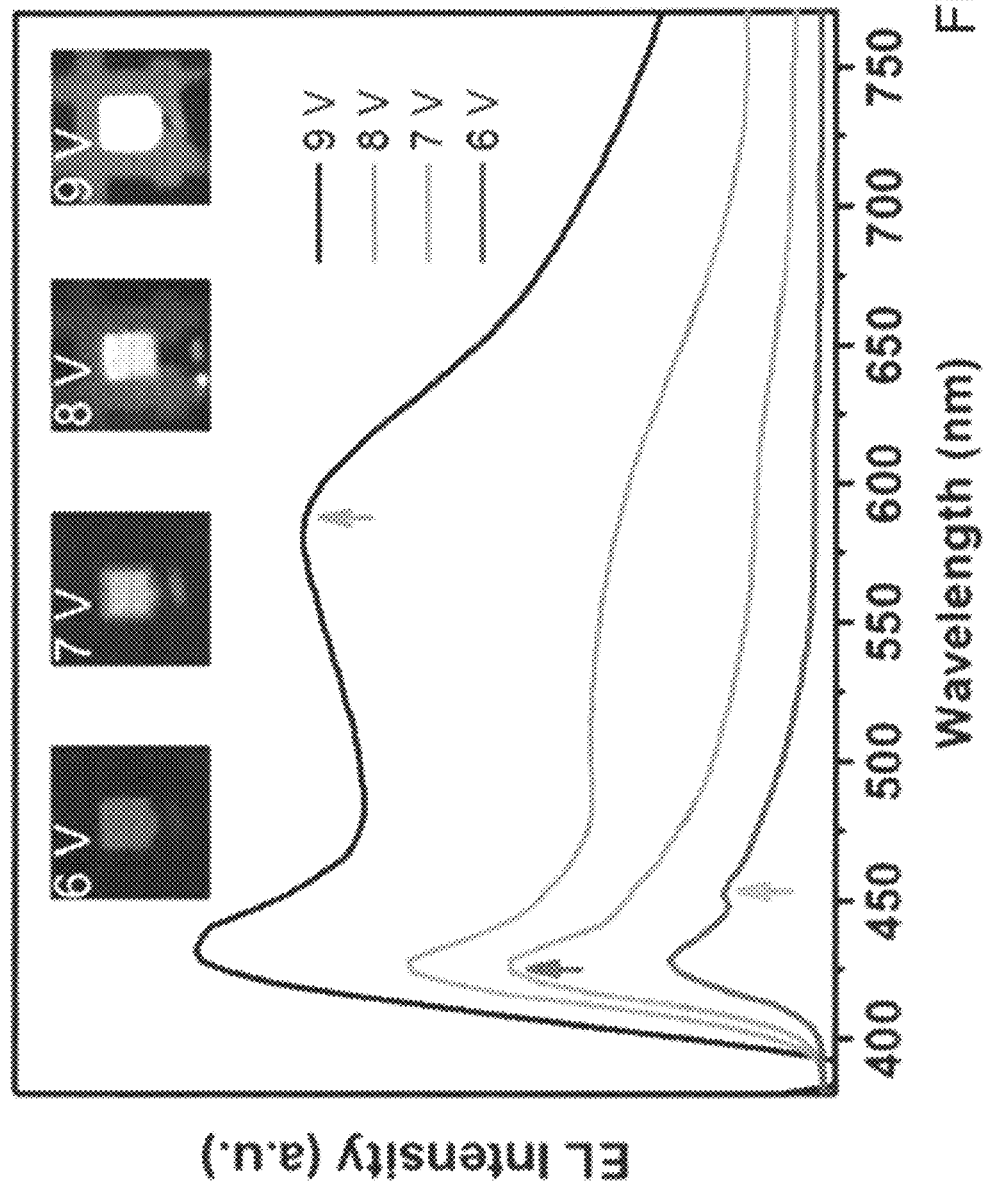
FIG. 7 shows the electroluminescence (EL) spectra and the true color photographs of blue, cyan, magenta, and white emissions for the same CD-LEDs in FIG. 5.
Figure 8:
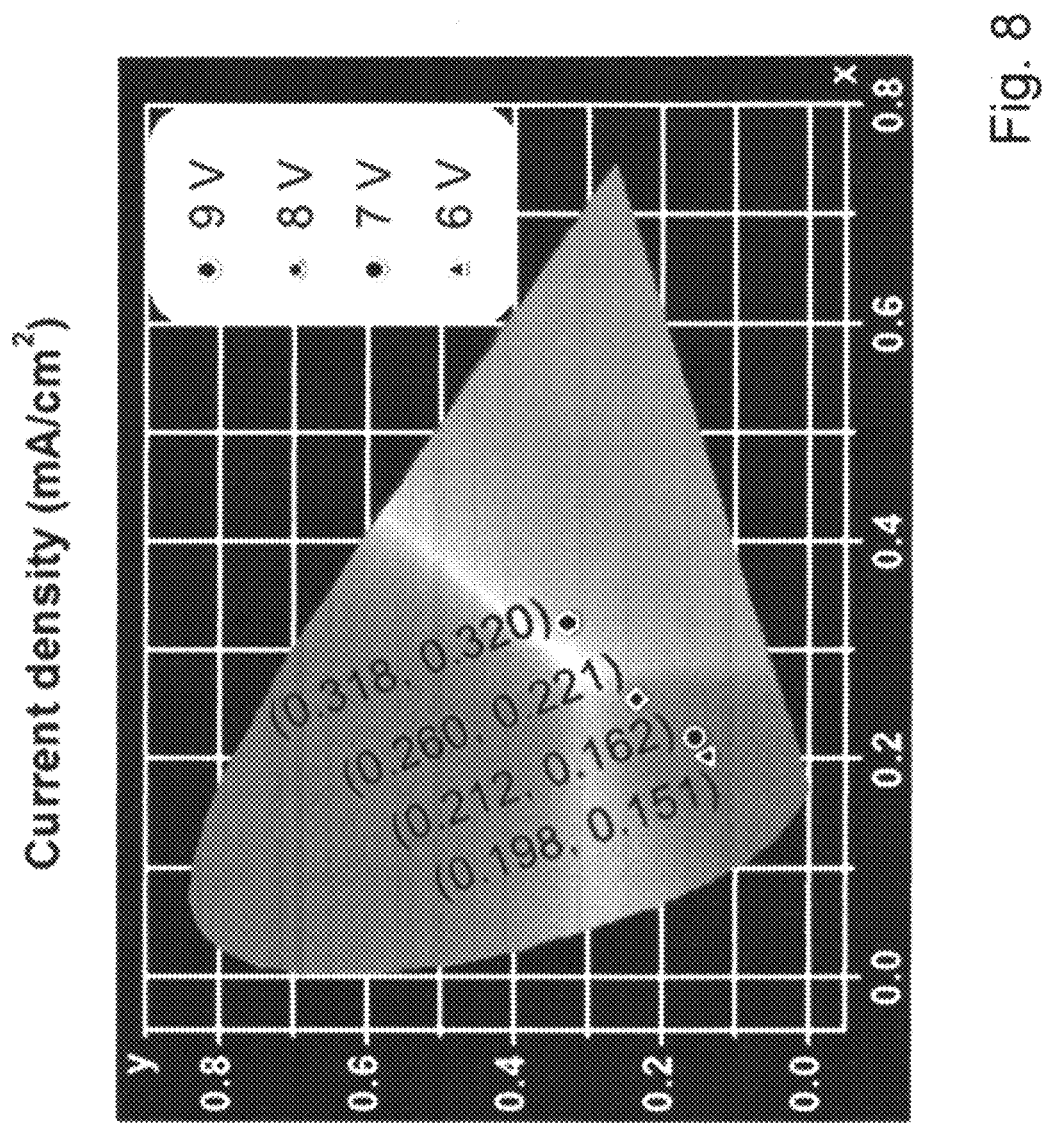
FIG. 8 gives the Commission Internationale de l'Enclairage (CIE) 1931 coordinates of the blue, cyan, magenta, and white emission from the same CD-LEDs in FIG. 5 operated at different voltages.

FIG. 5 shows the typical current density and luminance curves as a function of applied voltage for the CD-LEDs. The variation of the EL efficiency, across the entire measured luminance range and bias, is shown in FIG. 6. The devices demonstrate a low turn-on voltage of 5 V, confirming the reduced barrier height for charge injection into the CD-LEDs. The highest luminance and luminous efficiency reach 61 cd/m² and 0.018 cd/A, respectively. The EL spectra of the CD-LEDs, operated at different voltages, are shown in FIG. 7; images of the CD-LEDs under operation are presented in the insets of the figure. The CD-LEDs exhibited bright, uniform and defect-free EL emission. There is no obvious contribution from the polymer HTL or organic ETL in the EL spectra while the similar EL spectra can be obtained from the LED device without the polymer HTL or organic ETL. The CIE coordinates of the emitted lights of the CD-LEDs are (0.198, 0.151), (0.212, 0.162), (0.260, 0.221), and (0.318, 0.320) as shown in FIG. 8, corresponding to blue, cyan, magenta, and white lights, respectively. The current-voltage-luminescence and EL spectra can be achieved repeatedly for sealed CD-LEDs.

The light color from the CD-LEDs is apparently voltage-dependent for the same 3.3 nm CD particles (FIG. 7). The blue emission peak at 426 nm in FIG. 7 can be observed at a low bias of 6 V. With the increase of bias, the emission peak at 452 nm becomes stronger, and the color becomes cyan at the bias of 7 V. With the further increase of bias, the emission at 588 nm appears and becomes stronger changing the emission hue to magenta, and finally at higher driving voltage gives white emission from the CD-LEDs. It can be observed that there are three main emissions, peaked at 426, 452 and 588 nm in the white EL spectra, appears successively with increased bias (FIG. 7). Thus, the white emission at high bias is probably due to the appearance of multiple-recombination processes at high current density. This phenomenon is probably a result of the fact that several recombination mechanisms with different but not too dissimilar (final) excited state lifetimes co-exist in each single CD, allowing several recombination pathways without any particular one dominating completely.

Figure 9:
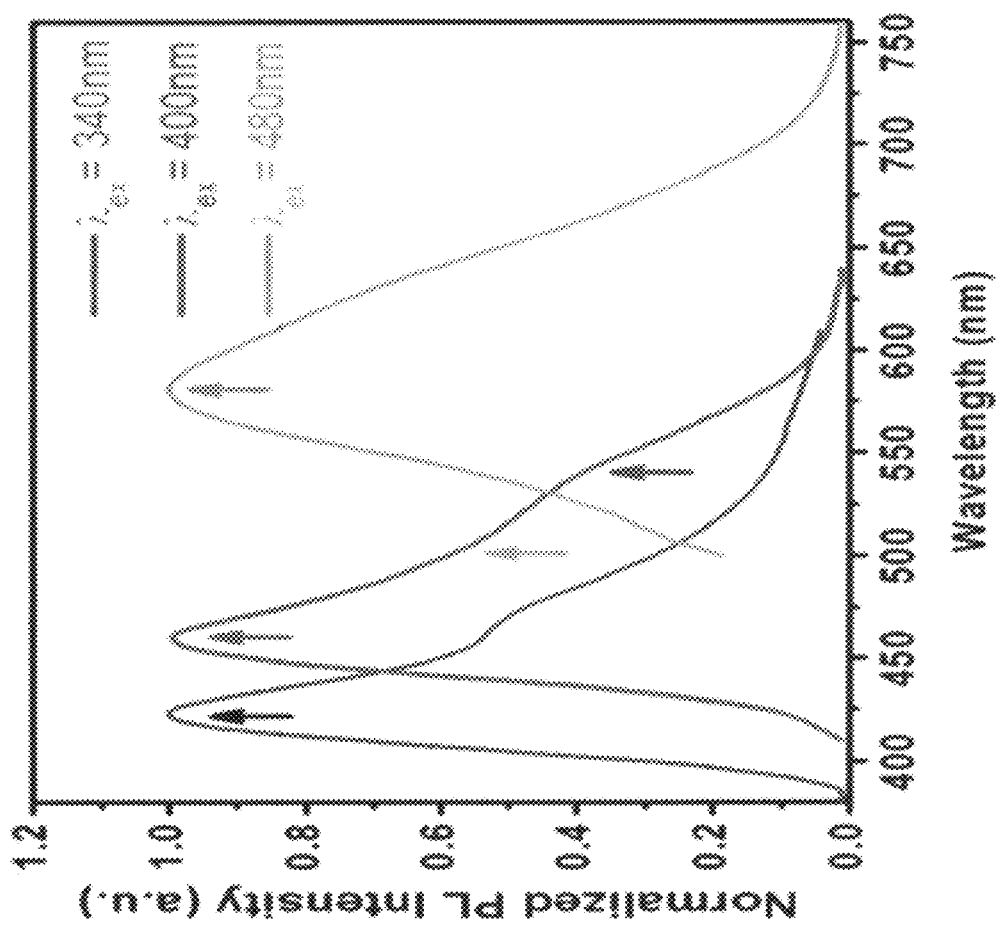
FIG. 9 shows the PL spectra of CDs excited by 3 different excitation wavelengths; the color-coded arrows represent the detection wavelength for the PL decay curves shown in FIG. 10.

The excitation-dependent PL spectra and PL decay curves are recorded in order to understand the recombination processes in the CDs and hence to further control the device emission. FIG. 9 shows the evolution of the PL emission spectra of the CDs, which exhibits excitation-dependent emission ranging from 400 to 700 nm, similar to the literature reports. When the CDs are excited by a short-wavelength light of 340 nm, a blue emission peaked at 420 nm is observed. When the excitation wavelength is 400 nm, the emission peak shifts to 460 nm, the emission at 420 nm becomes relatively weaker whilst a small emission peak at 580 nm appears. With a longer exciting wavelength of 480 nm, the emission peak at 580 nm becomes stronger. These three peaks are consistent to those observed in the EL spectra of CD-LEDs.

Figure 3:
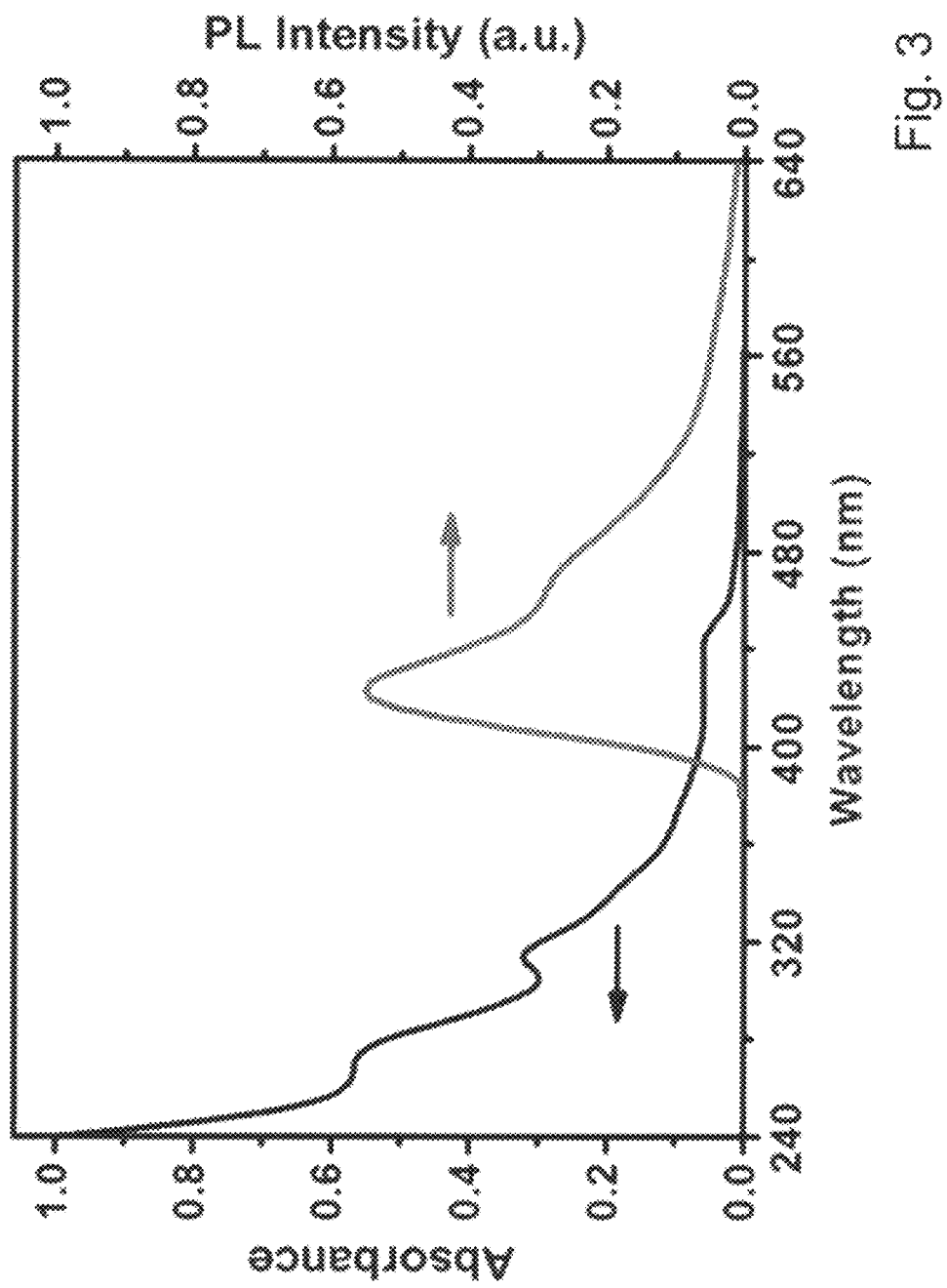
FIG. 3 shows the ultraviolet-visible (UV-Vis) absorption and photoluminescence (PL) (340 nm excitation wavelength) spectra of a CD thin film spin-coated on quartz glass.
Figure 4:
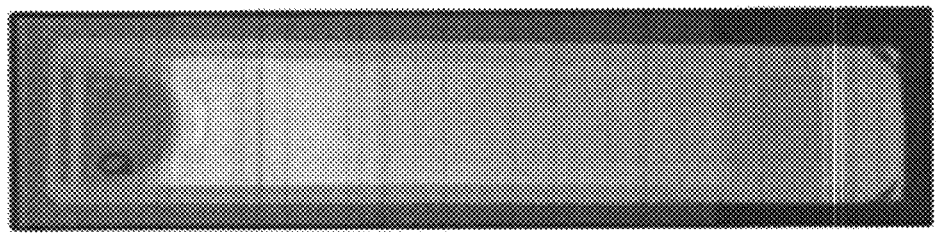
FIG. 4 shows a true-color photograph of CD emission (excited by 340 nm light) in solution.

The absorption spectrum of the CD films exhibits three peaks at 270, 315, and 450 nm as shown in FIG. 3. The peak at 270 nm can be ascribed to a π-π* transition of aromatic C=C bonds, while the peak at 315 nm may be attributed to an n-π* transition of C=O bonds and the broad peak at 450 nm may originate from the amino-functionalized surface of the CDs. After the excitation wavelength changes from 340 to 400 nm, the strong emission peaked at 420 nm disappears probably because the excitation energy is not sufficient to drive the π-π* transition. When the excitation wavelength changes to 480 nm, only the amino group-related emission peaked at 588 nm can be observed. That means that each of the three emission processes of the CDs relies on the excitation and can be selectively controlled via the absorption energy. It has to be noted that this phenomenon is quite similar to the recent reported PL from graphene dots, which also exhibits such selectable property attributed to independent molecule-like states through femtosecond transient absorption spectroscopy and femtosecond time-resolved fluorescence dynamics investigation.

Figure 10:
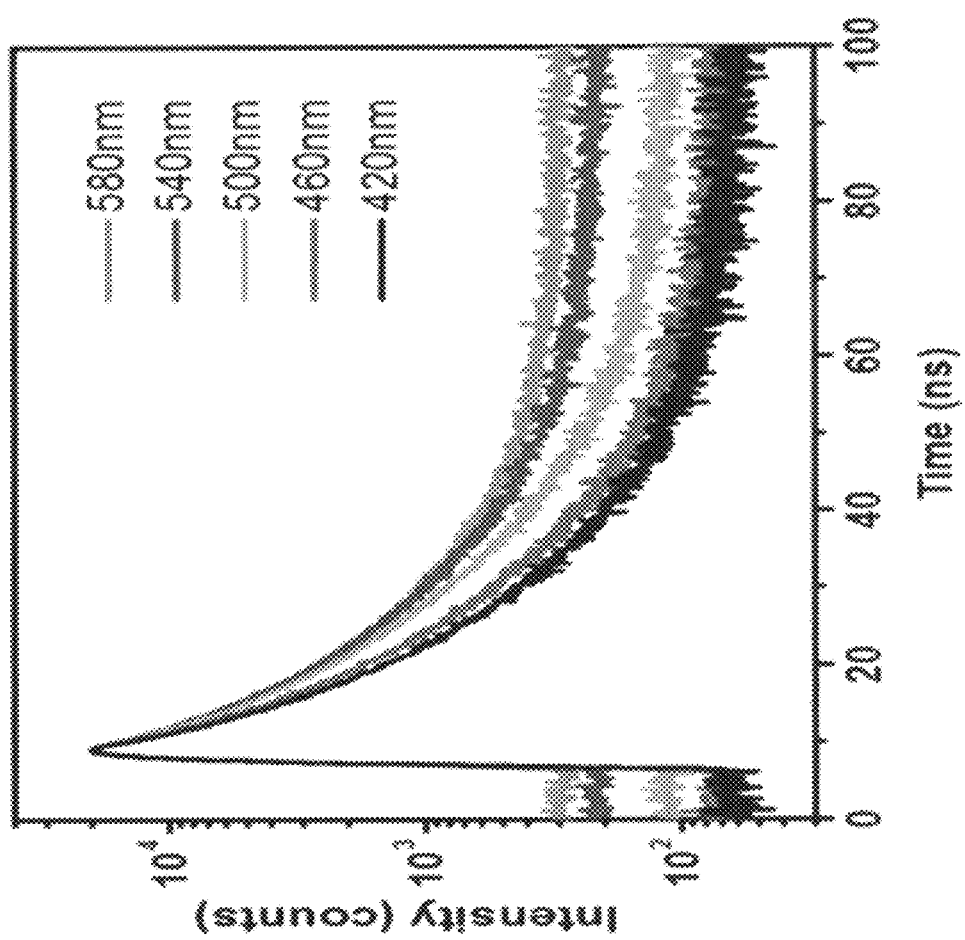
FIG. 10 gives the PL decay curves of CDs under 320 nm excitation detected at different wavelengths (420-580 nm)

PL decay curves have been analyzed in order to further characterize the origin of the emission components of the PL in CDs (FIG. 10). The radiative lifetime of PL emission is an important characteristic of light-emitting nanoparticles. Different radiative lifetimes may correspond to different electron-hole recombination mechanisms. Time-resolved, pulsed laser excitation techniques are most suitable for probing the lifetime of PL emission. FIG. 10 shows the representative PL decay curves of the CDs, which are probed at different emission wavelengths. The decay fitting results are listed in Table 1, with radiative lifetime $\tau_1$ of 2 ns, $\tau_2$ of 5~6 ns, and $\tau_3$ of 14~15 ns. It is found that the PL decays of the CDs are emission wavelength dependent. The amplitudes $A_1$ and $A_2$ with radiative lifetime of $\tau_1$ and $\tau_2$ account for a large amount of the PL emission spectra at short wavelength. The proportion of amplitude $A_1$ decreases and the strength of the processes associated with $A_3$ increases as the emission wavelength shifts from 420 to 580 nm while $A_2$ does not vary that much. Therefore, the short lifetime of 2 ns can be attributed to the emission peaked at 420 nm, the medium one of 5-6 ns corresponds to the emission peaked at 460 nm, and the long lifetime of 14~15 ns can be attributed to the emission peaked at 580 nm. Normally, relaxations (prior to radiative relaxation) involving the emission of high energy phonons will be more rapid (and so are associated with the fastest decay energy level). Therefore, when the excitation energy is high (e.g., 340 nm), the emission peaked at 420 nm is the dominant recombination channel as shown in FIG. 5.

TABLE 1

Fitted decay times and normalized amplitudes of the PL emission of CD film at different wavelengths under 320 nm excitation

| Emission wavelength/nm | $\tau_1$/ns | $A_1$/% | $\tau_2$/ns | $A_2$/% | $\tau_3$/ns | $A_3$/% |
|---|---|---|---|---|---|---|
| 580 | 2.1 | 19.1 | 5.5 | 47.6 | 14.0 | 33.3 |
| 540 | 2.1 | 19.6 | 5.8 | 49.4 | 15.0 | 31.0 |
| 500 | 2.0 | 21.1 | 5.8 | 49.9 | 15.1 | 29.0 |
| 460 | 2.0 | 28.4 | 5.4 | 49.5 | 14.8 | 22.1 |
| 420 | 2.0 | 32.4 | 5.1 | 48.3 | 14.0 | 19.3 |

Correspondingly, for the CD-LED's EL emission, when the injection current density is low, the carriers preferentially relax via the energy level associated with the faster decay channel. Thus blue emission is seen at low current density. When the current density is high enough, other emission colors (associated with slower recombination rates) are observed in the CD-LEDs. Therefore, the CD-LED's color-switchable EL is actually driven by the injection current density, not the apparently applied voltage.

According to the fluorescence lifetimes of different emission states of the CDs, the steady state PL spectra (FIG. 9) indicate that these emissive states are distinct energy levels (centered on 420, 460 and 580 nm) that have their own distinct excitation spectra. In the case of electroluminescence, electrons and holes are injected from the charge injection layers into the active emissive layer and only specific type of states will be excited. Since excitation of the specific states in the CDs are distinct (420, 480 and 580 nm) as shown in FIG. 9, the excited state that is formed via injected charges would emanate from the corresponding emission level associated with each color. The energy state with short lifetime (420 nm) will be very readily depopulated. Therefore, at low current density (or voltage), the carriers will initially be injected into the energy state with short lifetime due to this fast relaxation. When the current density is increased, the more highly populated high energy state can also feed the low energy states (i.e., 480 and 580 nm) and so emission from these levels becomes more significant alongside the direct relaxation from the 420 nm state.

EXAMPLES. BLUE EMITTING CD-LED DEVICE

Figure 11:
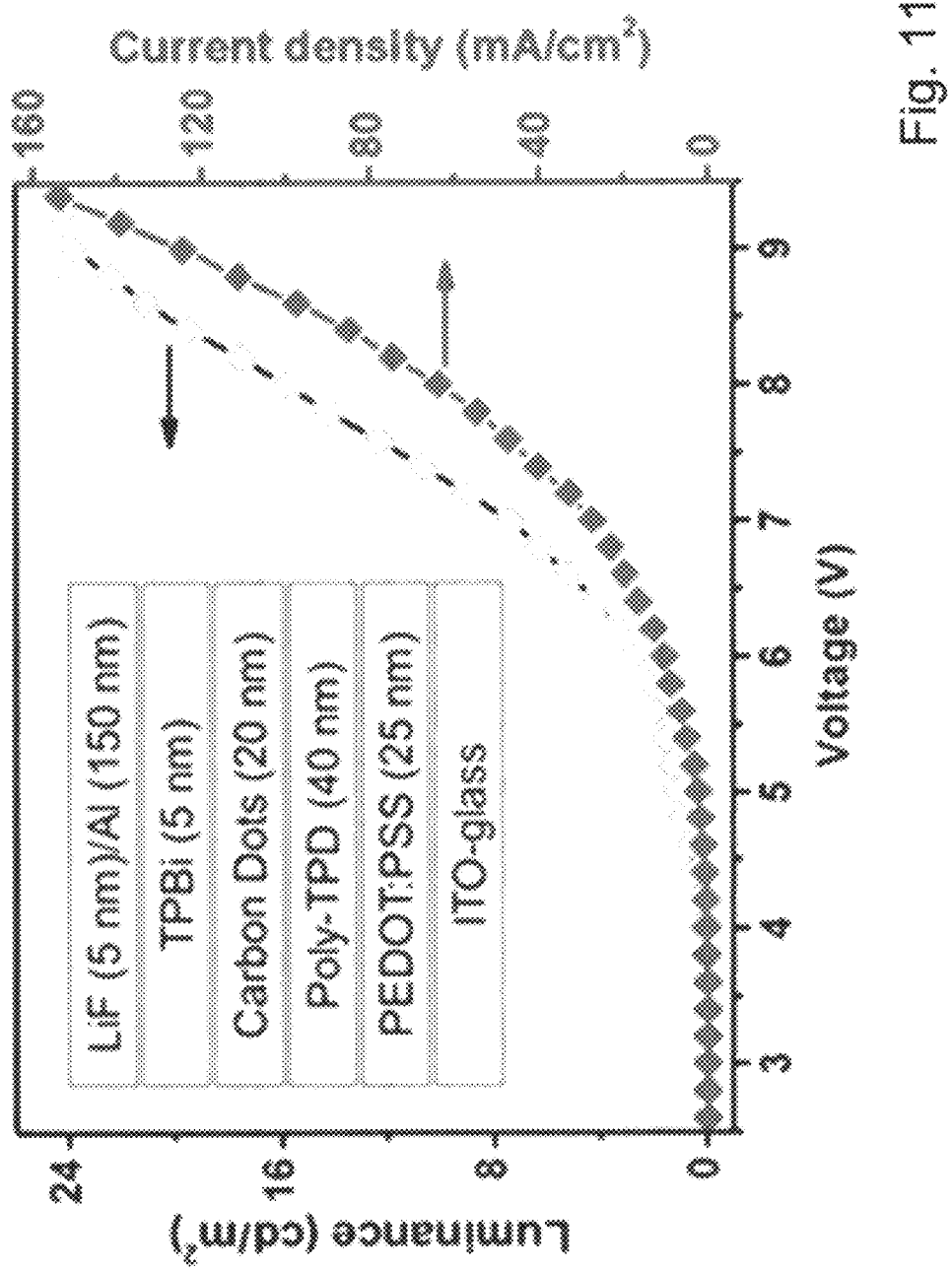
FIG. 11 shows the current density and brightness of the CD-LEDs with a different structure (using a 5 nm LiF layer) which is depicted as the inset.
Figure 12:
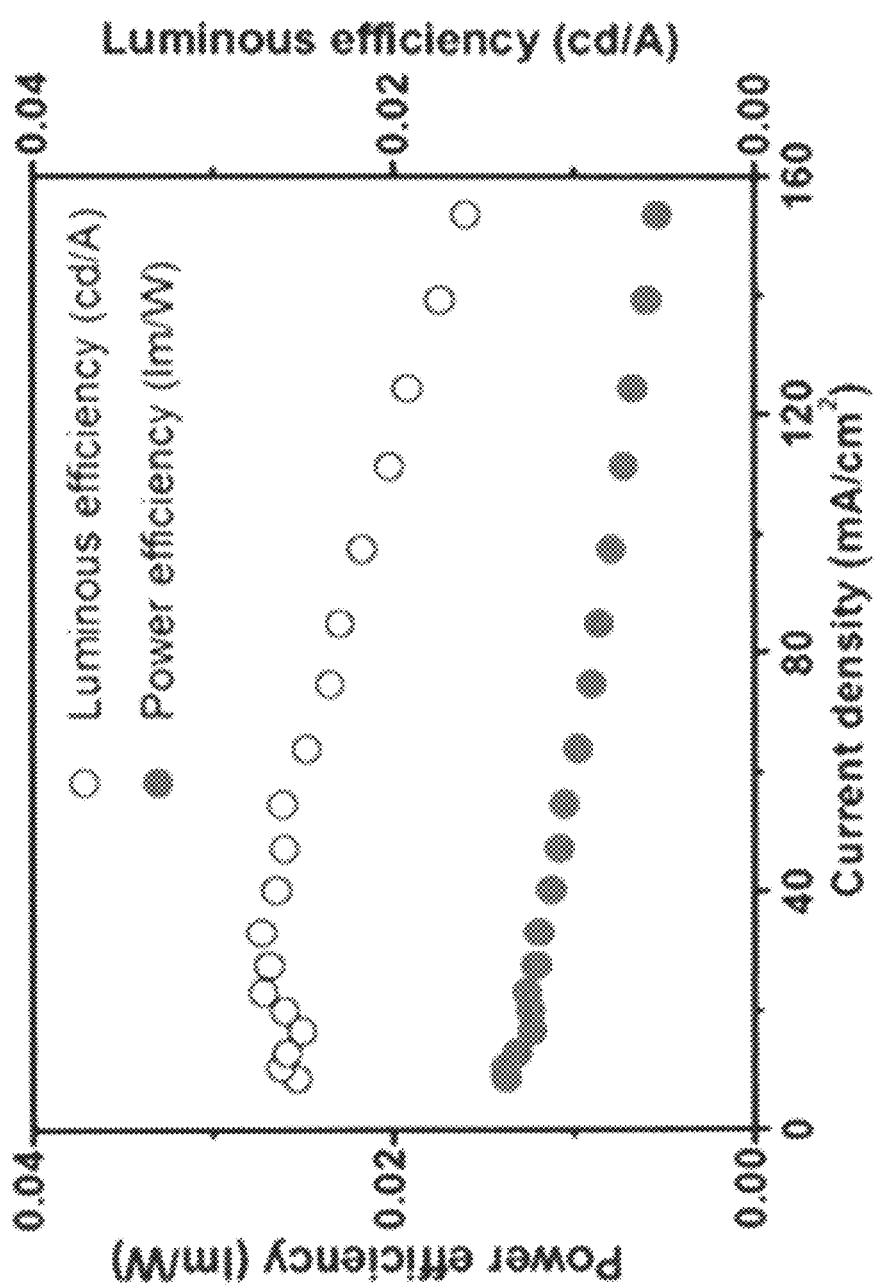
FIG. 12 is the luminous and power efficiency vs. current density for the CD-LEDs in FIG. 11.
Figure 13:
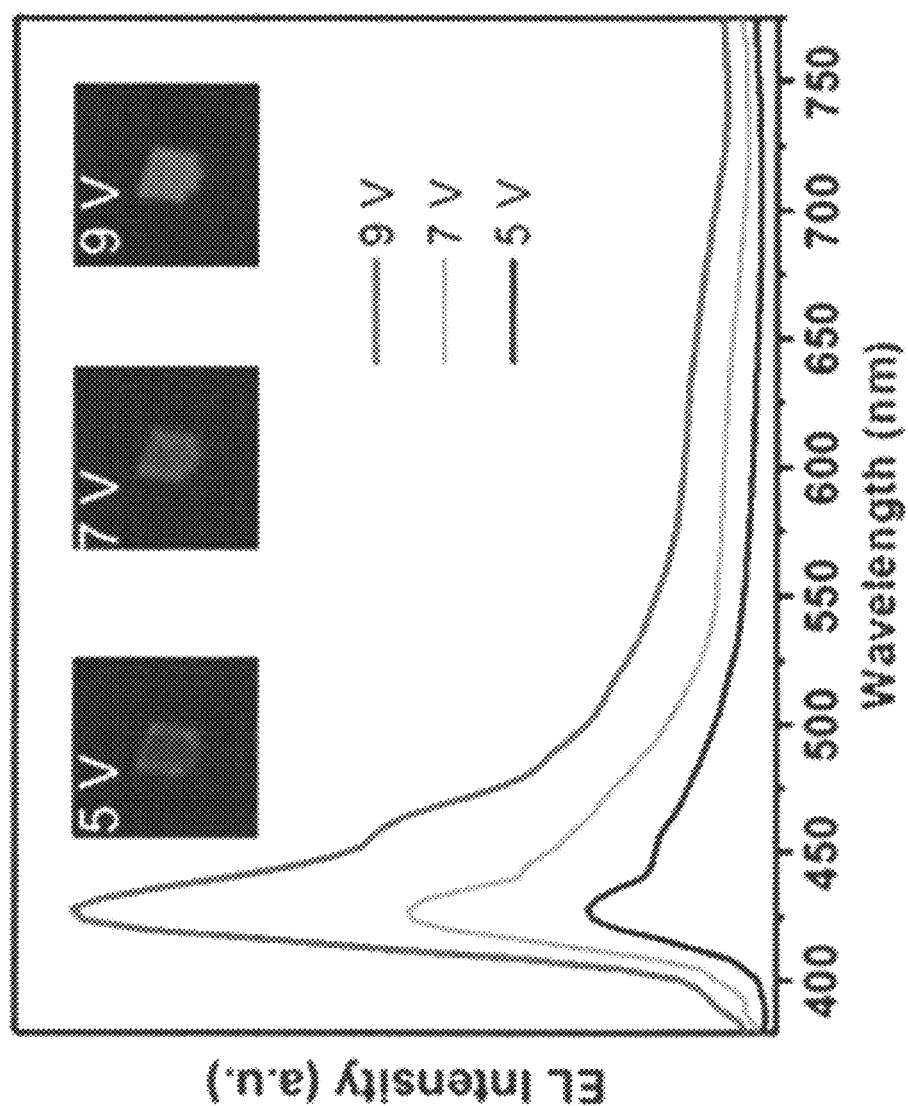
FIG. 13 shows the EL spectra and images of the same CD-LEDs in FIG. 11 operated at voltages of 5, 7, and 9V, respectively; These CD-LEDs emit blue light only; see the true color photographs.

Taking these findings into consideration, the CD-LED device structure is adjusted to control the current density and therefore the EL spectra. One way is to reduce the injection current density by increasing the thickness of the LiF layer to 5 nm (the inset of FIG. 11). FIG. 11 shows typical current and luminance curves as a function of the applied voltage for the pure blue emitting CD-LEDs with a cathode of 5-nm LiF and 150-nm Al. The devices exhibit a low turn-on voltage of 5 V, confirming a similar minimized barrier for charge injection into the CD-LEDs. The maximum luminance obtained is 24 cd/m$^2$. The current density is reduced to ~150 mA/cm$^2$ due to the increased thickness (correspondingly the increased resistance) of the LiF layer (5 nm). The variations of the power efficiency and the luminous vs. current density are shown in FIG. 12. The EL spectra of the blue CD-LEDs, operating at different voltages, are shown in FIG. 13; emitting images of the CD-LEDs under operation are also presented in the figure insets. The blue-emitting CD-LED exhibited bright, uniform and defect-free EL emission over the whole bias working range when the current injection was maintained low.

White Emitting CD-LED Device.

Figure 14:
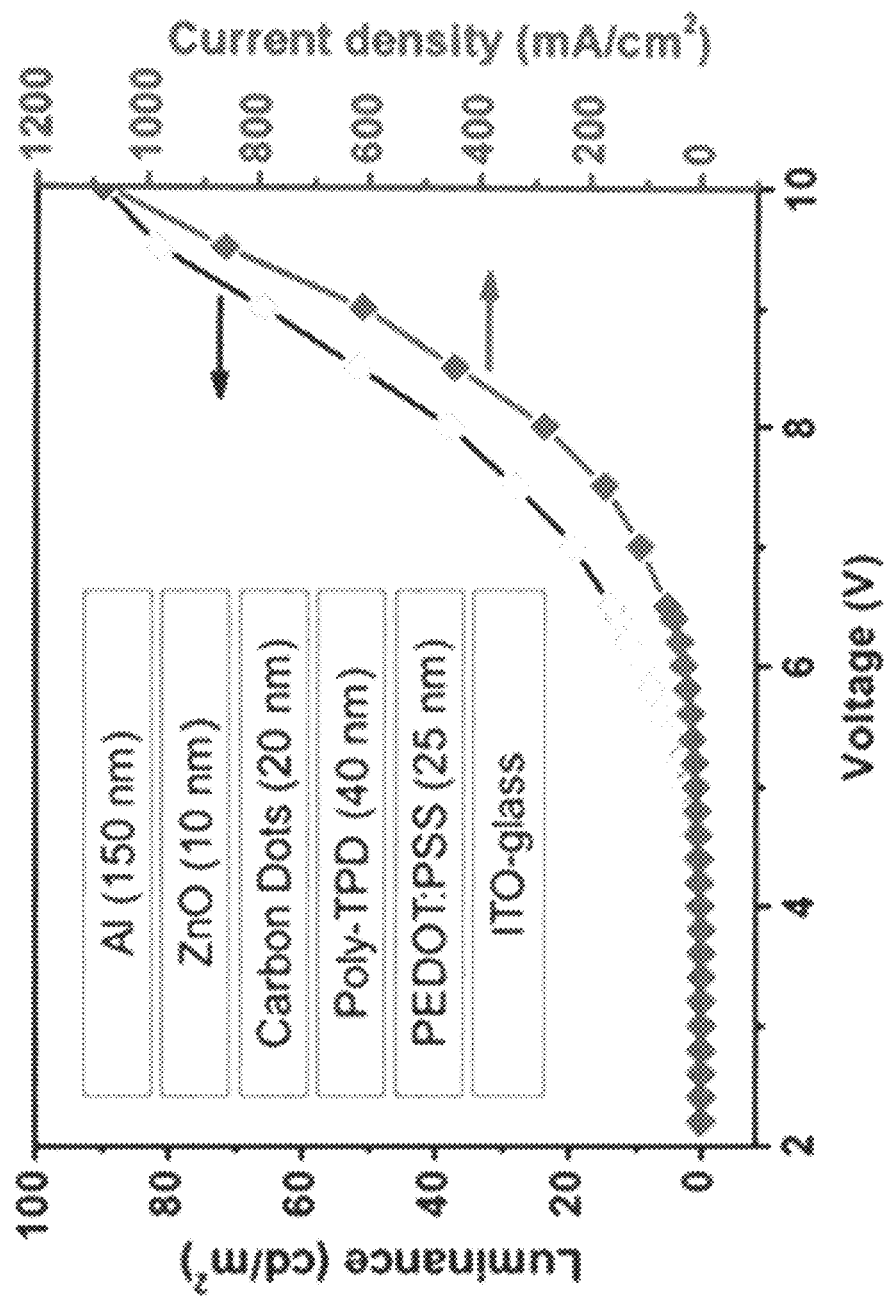
FIG. 14 shows the current density and brightness of a third structured CD-LEDs using ZnO nanoparticles as an electron transport layer.
Figure 15:
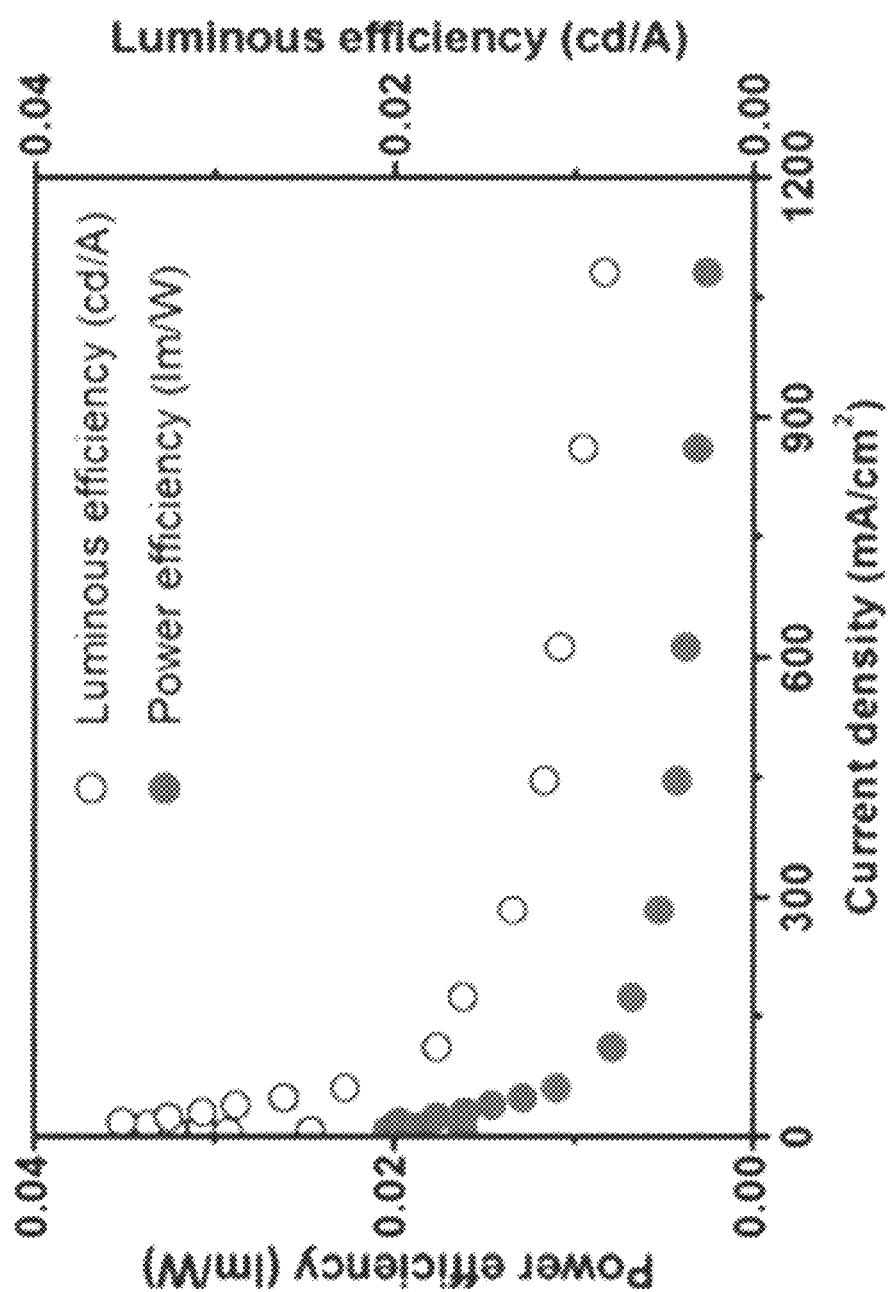
FIG. 15 is the luminous and power efficiency vs. current density for the CD-LEDs in FIG. 14.
Figure 16:
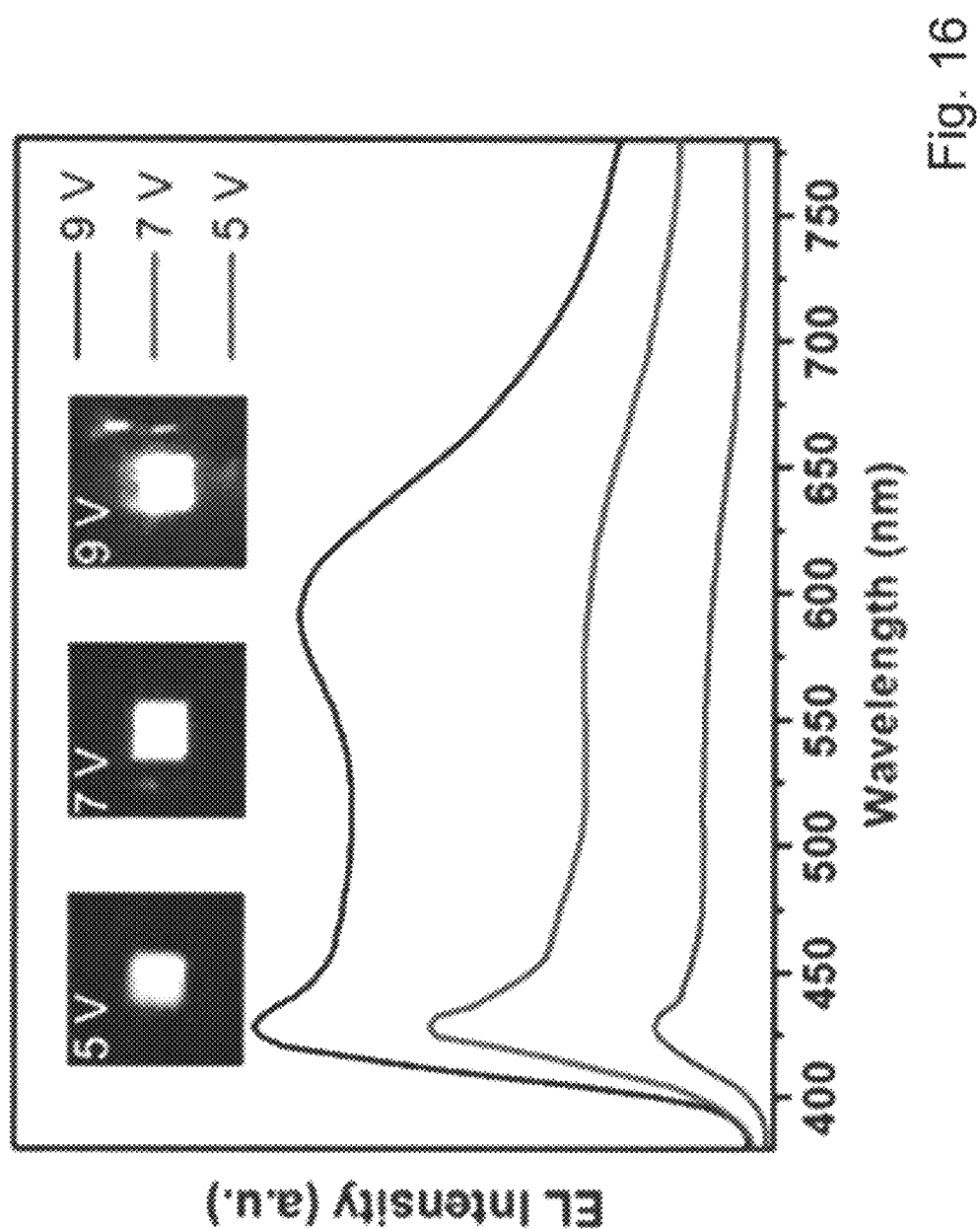
FIG. 16 shows the EL spectra of the CD-LEDs, with true-color photographs of the LEDs operated at different applied voltages. These CD-LEDS emit white light only.

Low current injection can be used to obtain pure blue emission from the above CD-LEDs. The inventors therefore deduce that high current injection would lead to white emission in the whole working bias. To realize it the inventors use ZnO nanoparticles as the ETL. The ZnO/CD-LED structure shown schematically in the inset of FIG. 14, consists of layers of ITO/PEDOT:PSS (25 nm, anode), poly-TPD (40 nm, HTL), CDs (20 nm, active emission layer), ZnO nanoparticles (10 nm, ETL), and Al (150 nm, cathode). FIG. 14 also gives the current density and luminance changes of the ZnO/CD-LEDs. The variations of the power efficiency and the luminous vs. current density are shown in FIG. 15. The maximum luminance for the resulting white light emitting devices reaches 90 cd/m$^2$. These ZnO/CD-LEDs exhibit turn-on voltages of 4.6 V, which is lower than those of the TPBI-based devices. The EL spectra measured using a high-sensitivity spectrometer indicate that the light emission from the white CD-LEDs is achieved at a driving voltage as low as 4.6 V, suggesting that electrons and holes can efficiently inject into the CD emitting layer at lower driving voltages. These devices have significantly higher current density than the devices without an ETL, or with a TPBI ETL. As the same HTLs are used in all the CD-LEDs, the high current density is attributed to the more efficient electron injection into the CD layer with a ZnO ETL. This is due to the higher electron mobility of the ZnO nanoparticles which has been reported to be $2 \times 10^{-3}$ cm$^2$ V$^{-1}$ s$^{-1}$, at least one order of magnitude higher than that of organic ETLs (typically $1 \times 10^{-4}$ cm$^2$ V$^{-1}$ s$^{-1}$ or lower). With more electrons accumulated at the poly-TPD/CD interface, the interfacial recombination rate is much higher in the ZnO/CD-LEDs than that in the other structures. The white light-emitting CD-LEDs exhibit bright, uniform and defect-free EL emission over the whole bias working range (FIG. 16).

While various embodiments of the present invention have been described in detail, it is apparent that various modifications and alterations of those embodiments will occur to and be readily apparent those skilled in the art. However, it is to be expressly understood that such modifications and alterations are within the scope and spirit of the present invention, as set forth in the appended claims. Further, the invention(s) described herein is capable of other embodiments and of being practiced or of being carried out in various other related ways. In addition, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items while only the terms "consisting of" and "consisting only of" are to be construed in the limitative sense.

Wherefore we claim:

1. A light emitting diode (LED) device comprising:
   a hole transport layer;
   an electron transport layer,
   an active emissive layer between the hole transport layer and the electron transport layer; and
   carbon dots forming the active emissive layer;
   wherein the light emitting diode device is an electroluminescent light emitting diode device, and the carbon dots are substantially spherical in shape.

2. The LED device of claim 1 wherein the carbon dots are formed of an organic carbon-containing materials.

3. The LED device of claim 1 wherein the carbon dots are between 0.5 and 20 nm in size.

4. The LED device of claim 1 further comprising a transparent conducting film anode, the transparent conducting film including one of indium tin oxide (ITO), fluorine doped tin oxide (FTO), carbon nanotube networks, and graphene.

5. The LED device of claim 1 further comprising a hole injection layer (HIL) including one of poly(ethylenedioxythiophene):polystyrene sulphonate (PEDOT:PSS), the hole injection layer having a thickness of between 10 and 100 nm.

6. The LED device of claim 1 wherein the hole transport layer (HTL) includes one of poly(N,N'-bis(4-butylphenyl)-N,N'-bis(phenyl)benzidine) (poly-TPD) and poly(N-vinylcarbazole) (PVK), the hole transport layer having a thickness of between 10 and 100 nm.

7. The LED device of claim 1 wherein the carbon-dot active emissive layer has a thickness of between 10 and 100 nm.

8. The LED device of claim 1 wherein the electron transport layer includes 1,3,5-tris(N-phenylbenzimidazol-2-yl)benzene (TPBI) at a thickness of between 2 to 50 nm thick.

9. The LED device of claim 8 further comprising followed by a LiF/Al bilayer cathode, where the LiF layer has a thickness of between 1 and 20 nm and the Al layer has a thickness of between 10 and 300 nm.

10. The LED device of claim 1 wherein the electron transport layer includes ZnO nanoparticle, where the electron transport layer has a thickness of between 5 and 100 nm thick.

11. The LED device of claim 10, further comprising an Al cathode having a thickness of 10 between 300 nm.

12. The LED device of claim 1 further comprising a hole injection layer sandwiched between a transparent conducting film anode and the hole transport layer, and a the electron transport layer sandwiched between the carbon dot active emissive layer and a cathode.

13. The LED device of claim 1
further comprising
- a transparent conducting film anode, the transparent conducting film including one of indium tin oxide (ITO), fluorine doped tin oxide (FTO), carbon nanotube networks, and graphene;
- a hole injection layer (HIL) including one of poly (ethylenedioxythiophene):polystyrene sulphonate (PEDOT:PSS), the hole injection layer having a thickness of between 10 and 100 nm;
- the hole transport layer (HTL) includes one of poly(N, N'-bis(4-butylphenyl)-N,N'-bis(phenyl)benzidine) (poly-TPD) and poly(N-vinylcarbazole (PVK), the hole transport layer having a thickness of between 10 and 100 nm; and
- a LiF/Al bilayer cathode, where the LiF layer has a thickness of between 1 and 20 nm and the Al layer has a thickness of between 10 and 300 nm;

wherein
- the carbon dots are between 0.5 and 20 nm in size;
- the carbon-dot active emissive layer has a thickness of between 10 and 100 nm;
- the electron transport layer includes 1,3,5-(N-phenyl-benzimidazol-2-yl)benzene (TPBI) at a thickness of between 2 to 50 nm thick; and
- the electron transport layer includes ZnO nanoparticle, where the electron transport layer has a thickness of between 5 and 100 nm thick.

14. The LED device of claim 1 wherein the carbon dots are formed of an inorganic carbon-containing material.

* * * * *